United States Patent
Yang et al.

(10) Patent No.: US 11,839,046 B2
(45) Date of Patent: Dec. 5, 2023

(54) CASE FOR RECEIVING ELECTRONIC DEVICE

(71) Applicant: DELTA ELECTRONICS, INC., Taoyuan (TW)

(72) Inventors: Shan-Chun Yang, Taoyuan (TW); Kuan-Lung Wu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/711,458

(22) Filed: Apr. 1, 2022

(65) Prior Publication Data
US 2023/0320018 A1    Oct. 5, 2023

(51) Int. Cl.
*H05K 7/14*   (2006.01)
*H05K 5/02*   (2006.01)

(52) U.S. Cl.
CPC ......... *H05K 7/1489* (2013.01); *H05K 5/0221* (2013.01); *H05K 5/0226* (2013.01); *H05K 7/1418* (2013.01)

(58) Field of Classification Search
None
See application file for complete search history.

(56) References Cited

U.S. PATENT DOCUMENTS

| 10,178,793 | B1 * | 1/2019 | Hsu | H05K 7/1488 |
| 2009/0050461 | A1 * | 2/2009 | Alo | G06F 1/16 |
| | | | | 200/5 B |
| 2019/0364681 | A1 * | 11/2019 | Hangebrauck | H05K 5/0221 |

FOREIGN PATENT DOCUMENTS

| CN | 205196146 U | * | 4/2016 |
| CN | 111757623 A | * | 10/2020 |
| CN | 212112327 U | * | 12/2020 |
| JP | 3005187 | | 12/1994 |
| JP | 2005116620 | | 4/2005 |
| JP | 2005317693 | | 11/2005 |

* cited by examiner

*Primary Examiner* — James Wu
*Assistant Examiner* — Christopher L Augustin
(74) *Attorney, Agent, or Firm* — Muncy, Geissler, Olds & Lowe, P.C.

(57) ABSTRACT

A case for receiving at least one electronic device is provided, including a housing, a hinge, a locking member, and a cover. The housing has an accommodating space and an opening communicated with the accommodating space. The hinge is slidably connected to the housing. The cover has an upper side, a lower side, and an outer surface. The lower side is pivotally connected to the hinge. When the locking member affixes the upper side to the housing and the hinge is in a first position relative to the housing, the cover is disposed between an environment space and the accommodating space, and the outer surface faces the environment space. When the locking member is released and the hinge moves to a second position relative to the housing, the cover leaves the position between the environment space and the accommodating space, and the outer surface faces the environment space.

15 Claims, 13 Drawing Sheets

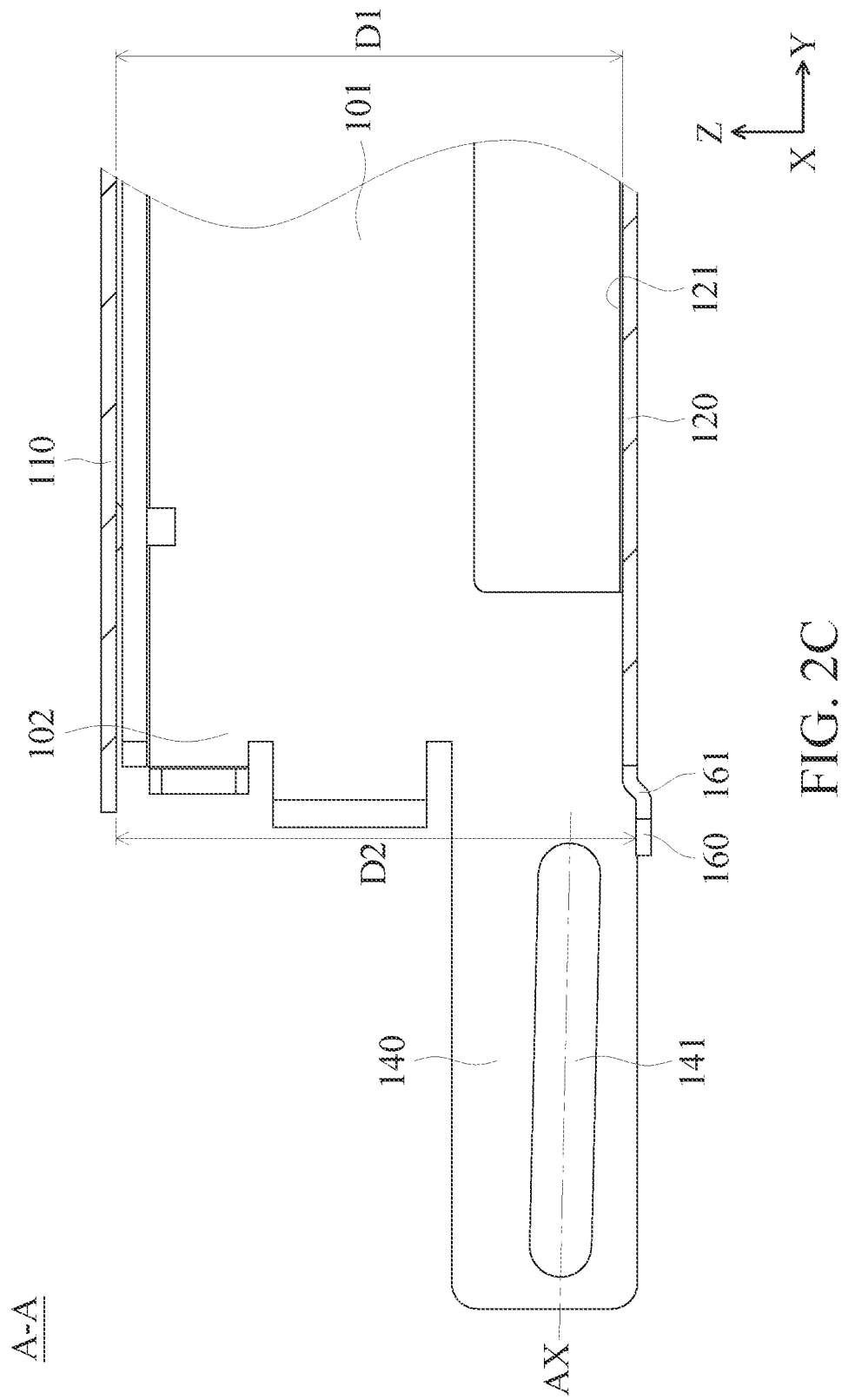

CASE FOR RECEIVING ELECTRONIC DEVICE

BACKGROUND OF THE INVENTION

Field of the Invention

The application relates in general to a case, and in particular, to a case for receiving at least one electronic device.

Description of the Related Art

In most electronic systems (such as data centers, servers, and computers), electronic devices should be disposed inside of a case, to protect them. In order to identify the position of an electronic device, the information and the status of the electronic device is marked on the door of the housing in some electronic systems. Moreover, when the user maintains the electronic system, he or she may note the operation on a label on the door after maintenance.

However, when the door is opened, the user cannot simultaneously maintain the electronic devices and see their information and status, or write down the operation on the label. Therefore, how to address the aforementioned problem has become an important issue.

BRIEF SUMMARY OF INVENTION

To address the deficiencies of conventional products, an embodiment of the invention provides a case for receiving at least one electronic device, including a housing, a hinge, a locking member, and a cover. The housing has an accommodating space and an opening that is communicated with the accommodating space, wherein the accommodating space is configured to receive the electronic device. The hinge is slidably connected to the housing. The cover has an upper side, a lower side, and an outer surface, wherein the upper side is detachably connected to the housing by the locking member, and the lower side is pivotally connected to the hinge. When the locking member affixes the upper side to the housing and the hinge is in a first position relative to the housing, the cover is disposed between an environment space and the accommodating space, and the outer surface faces the environment space. When the locking member is released and the hinge moves from the first position to a second position relative to the housing, the cover leaves the position between the environment space and the accommodating space, and the outer surface faces the environment space.

In some embodiments, the housing includes a protruding edge, and the opening is disposed between the protruding edge and the accommodating space. When the locking member is released and the hinge moves from the first position to the second position relative to the housing, an inner surface of the cover is in contact with the protruding edge.

In some embodiments, a hole is formed on the protruding edge, and the cover has an engaging portion. When the locking member is released and the hinge moves from the first position to the second position relative to the housing, the engaging portion is inserted into the hole.

In some embodiments, the housing further comprises a top wall and a bottom wall, the accommodating space is formed between the top wall and the bottom wall, and the protruding edge is connected to the bottom wall. In some embodiments, the distance between the top wall and the bottom wall is less than the distance between the top wall and the protruding edge. When the locking member is released and the hinge moves from the first position to the second position relative to the housing, the outer surface of the cover is aligned with the upper surface of the bottom wall.

In some embodiments, the housing comprises a guiding slot, and the hinge is slidably disposed in the guiding slot. The longitudinal axis of the guiding slot is inclined relative to the upper surface of the bottom wall, and the opening is situated between the guiding slot and the accommodating space.

In some embodiments, the housing comprises a rail, the case further comprises a slider slidably connected to the rail, and the hinge is affixed to the slider. When the hinge is in the first position relative to the housing, the slider does not protrude from the opening.

In some embodiments, the case further comprises a label attached to the outer surface.

A case for receiving at least one electronic device is also provided, including a housing, a cover, and a label. The housing has an accommodating space, an opening that is communicated with the accommodating space, and a protruding edge, wherein the opening is disposed between the protruding edge and the accommodating space. The label is disposed on the cover. When the cover is in the closed position, the cover covers the opening, and the label is exposed from an environment space. When the cover moves and rotates from the closed position to the open position, the cover is in contact with the protruding edge, the accommodating space is communicated with the environment space via the opening, and the label is exposed from the environment space.

In some embodiments, a hole is formed on the protruding edge, and the cover has an engaging portion. When the cover is in the open position, the engaging portion is inserted into the hole.

In some embodiments, the housing further comprises a top wall and a bottom wall, the accommodating space is formed between the top wall and the bottom wall, and the protruding edge is connected to the bottom wall.

In some embodiments, the distance between the top wall and the bottom wall is less than the distance between the top wall and the protruding edge. The label is attached to the outer surface of the cover, and the bottom wall has an upper surface facing the top wall. When the cover is in the open position, the outer surface of the cover is aligned with the upper surface of the bottom wall.

In some embodiments, the case further comprises a hinge, and the cover is pivotally connected to the housing via the hinge. The hinge and the protruding edge are adjacent to the same side of the housing.

In some embodiments, the hinge is movable relative to the housing in a moving direction, and the housing further comprises a bottom wall, wherein the moving direction is inclined relative to the upper surface of the bottom wall.

BRIEF DESCRIPTION OF DRAWINGS

The invention can be more fully understood by reading the subsequent detailed description and examples with references made to the accompanying drawings, wherein:

FIG. 2C is a cross-sectional view taken along the line A-A in FIG. 2B;

DETAILED DESCRIPTION OF INVENTION

The making and using of the embodiments of the case for receiving at least one electronic device are discussed in detail below. However, that the embodiments provide many applicable inventive concepts that can be embodied in a wide variety of specific contexts. The embodiments discussed are merely illustrative of the ways to make and use the embodiments, and do not limit the scope of the invention.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
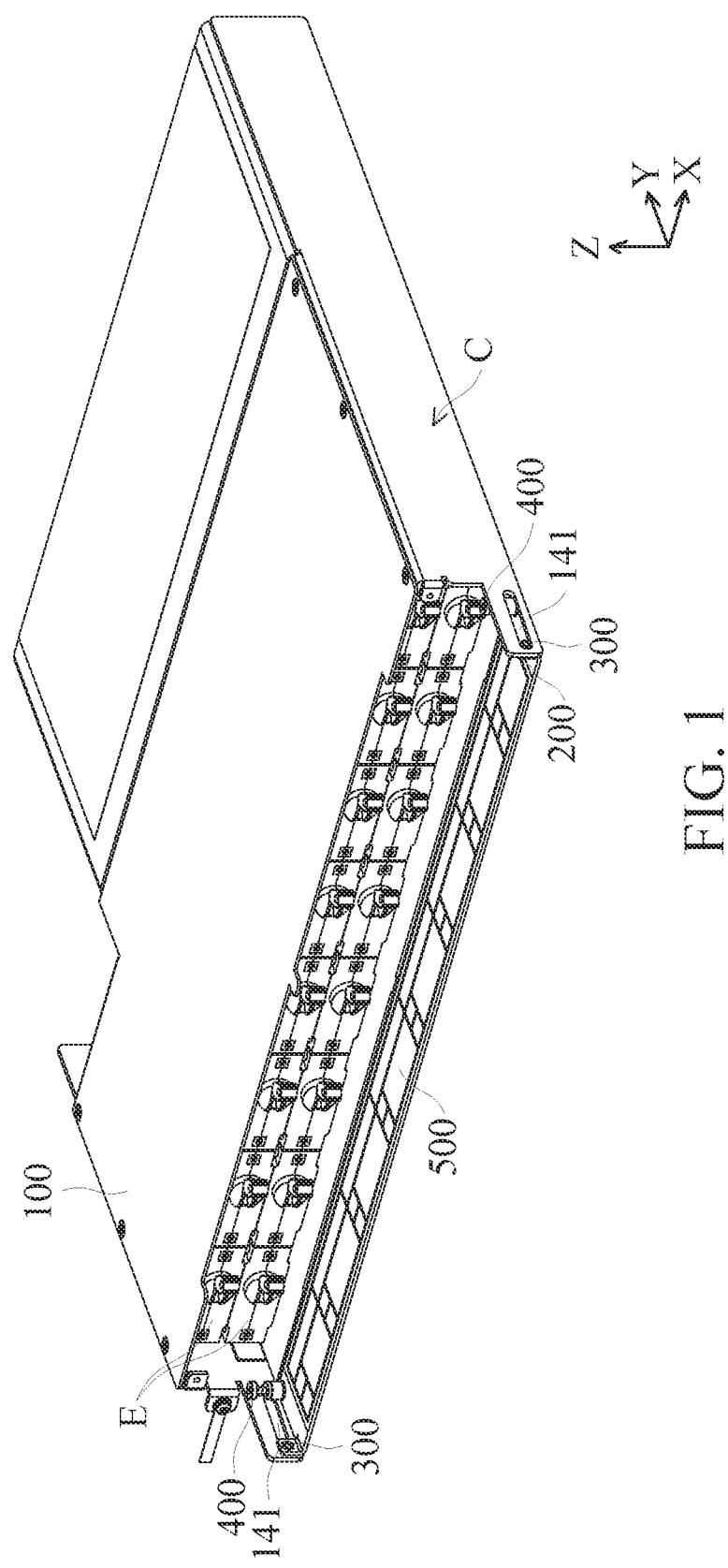
FIG. 1 is a schematic diagram of a case according to an embodiment of the invention.

FIG. 1 is a schematic diagram of a case C according to an embodiment of the invention. The case C is configured to receive one or more electronic devices E, such as a processor, a storage device (for example, a hard disk drive, a solid-state drive, and/or a memory), a temperature controller (for example, a air-cooling device and/or a liquid-cooling device), a transmitting device (for example, a network bridge and/or a router), and/or a power supply. The case C can be used in a data center, a sever, or a computer, but it is not limited thereto.

As shown in FIG. 1, the case C primarily includes a housing 100, a cover 200, at least one hinge 300, at least one locking member 400, and a label 500. The structures of the aforementioned members and relationships between them are discussed below.

Figure 2A:
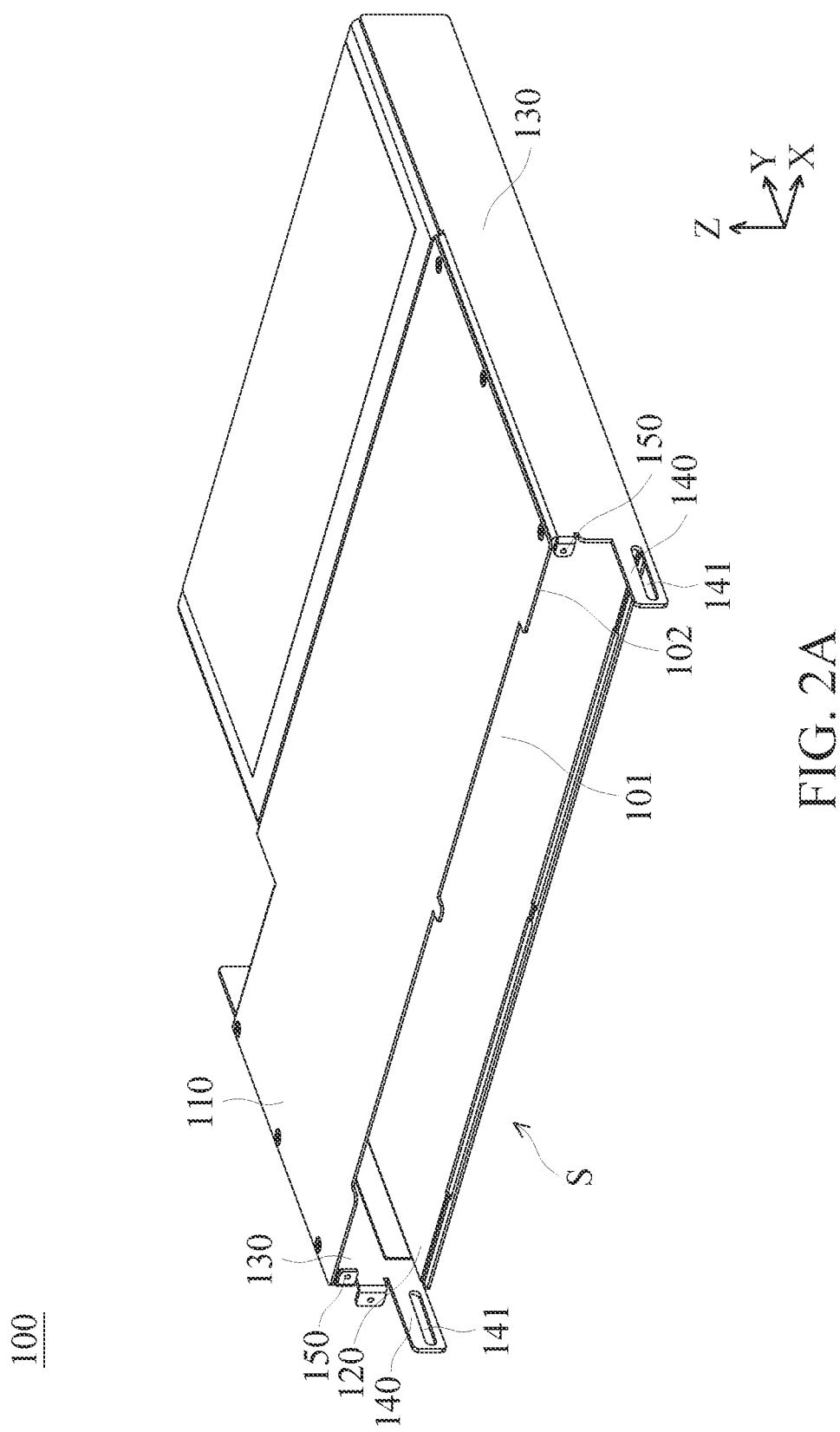
FIG. 2A is a schematic diagram of a housing according to an embodiment of the invention.

Referring to FIG. 1 and FIG. 2A, the housing 100 includes a top wall 110, a bottom wall 120, a plurality of lateral walls 130, at least one guiding portion 140, and at least one locking portion 150. The top wall 110 is substantially parallel to the bottom wall 120, the top wall 110 and the bottom wall 120 are substantially perpendicular to the lateral walls 130, and the lateral walls 130 connect the top wall 110 to the bottom wall 120. Therefore, a hollow box can be formed by the top wall 110, the bottom wall 120, and the lateral walls 130. In other words, an accommodating space 101 can be formed between the top wall 110 and the bottom wall 120, and surrounded by the top wall 110, the bottom wall 120, and the lateral walls 130.

The electronic devices E can be detachably disposed in the accommodating space 101. It should be noted that, the accommodating space 101 is communicated with an environment space S through an opening 102, so that the electronic devices E can enter into or leave the accommodating space 101 through the opening 102.

The guiding portion 140 is connected to one of the lateral walls 130 and protrudes from the opening 102, and a guiding slot 141 is formed on the guiding portion 140. In this embodiment, the guiding slot 141 is adjacent to the bottom side of the housing 100. Thus, in the Z-axis, the distance between the top wall 110 and the guiding slot 141 is greater than the distance between the bottom wall 120 and the guiding slot 141.

The locking portion 150 is connected to one of the lateral walls 130 or the top wall 110, and is adjacent to the top side of the housing 100. Thus, the distance between the top wall 110 and the locking portion 150 is less than the distance between the bottom wall 120 and the locking portion 150.

Figure 2B:
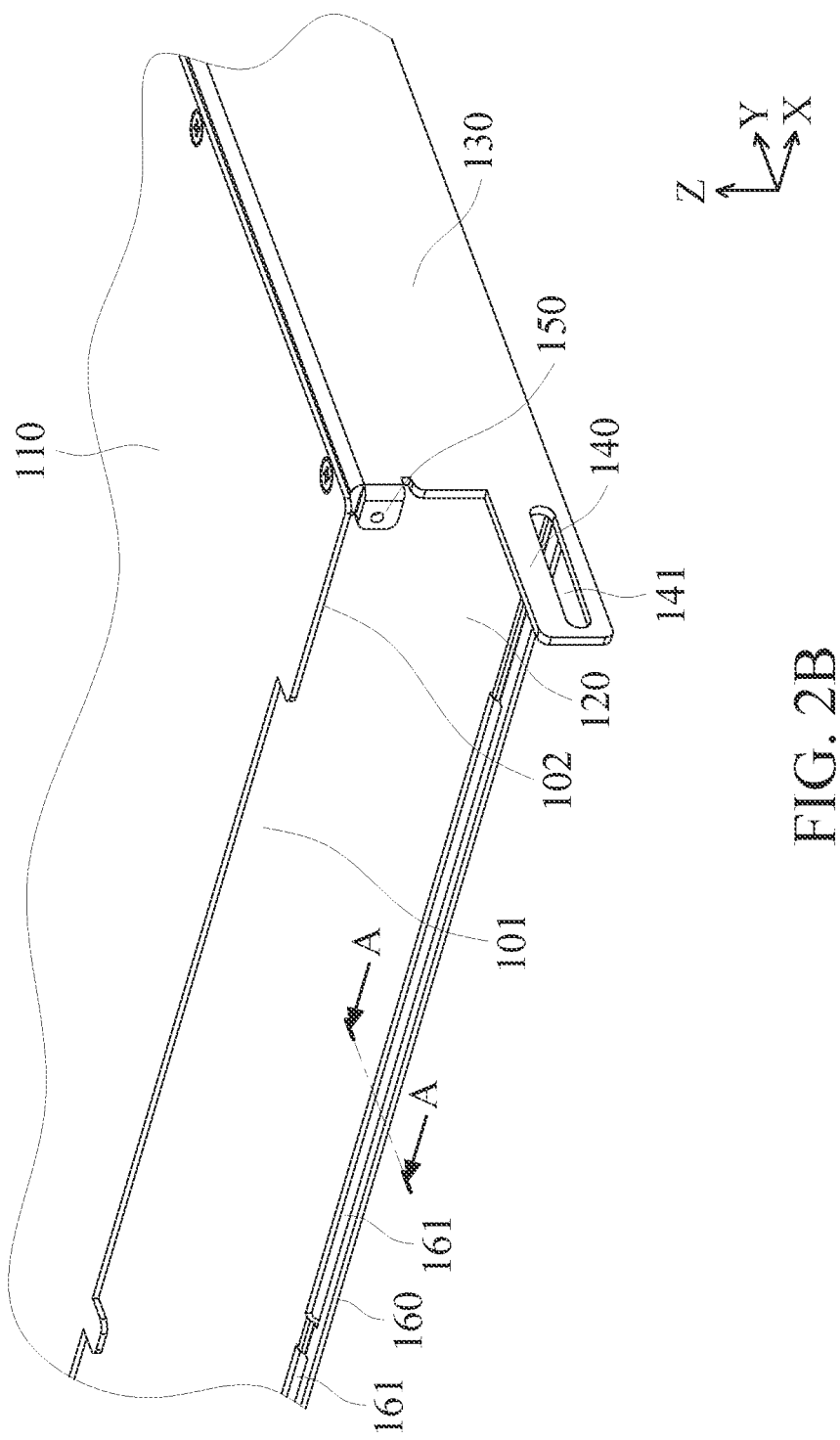
FIG. 2B is a partial enlarged view of the housing according to an embodiment of the invention.

Referring to FIG. 2B and FIG. 2C, in this embodiment, the housing 100 further includes a protruding edge 160. The protruding edge 160 is extended from the bottom wall 120 and exceeds the opening 102, so that the opening 102 is disposed between the protruding edge 160 and the accommodating space 101. One or more holes 161 can be formed on the protruding edge 160. In this embodiment, the distance D1 between the top wall 110 and the bottom wall 120 is less than the distance D2 between the top wall 110 and the protruding edge 160, and the longitudinal axis AX of the guiding slot 141 is inclined relative to the upper surface 121 of the bottom wall 120.

Figure 3:
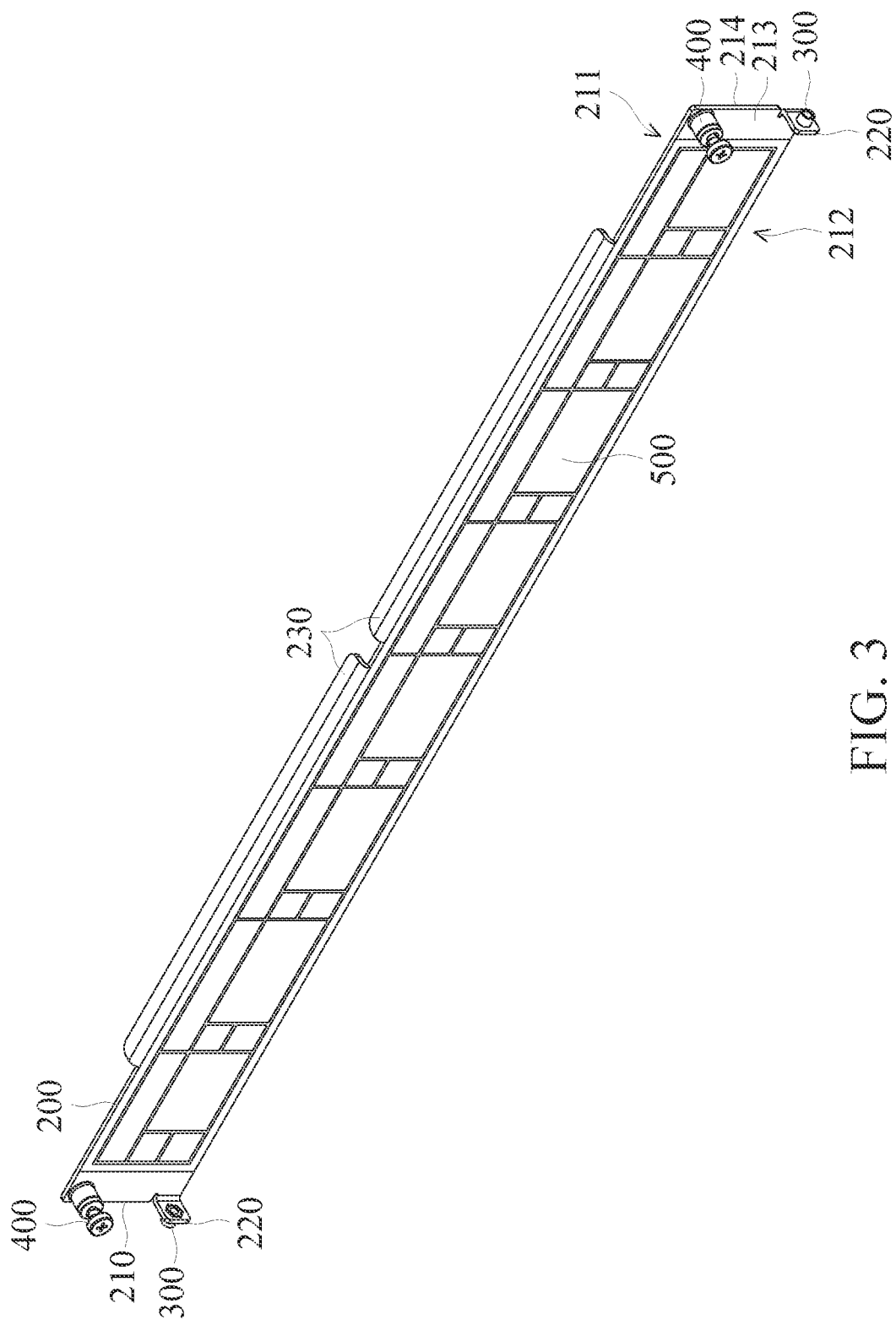
FIG. 3 is a schematic diagram of a cover according to an embodiment of the invention.

Referring to FIG. 1 and FIG. 3, the cover 200 includes a main body 210, at least one pivoting portion 220, and at least one engaging portion 230. The main body 210 has an upper side 211 and a lower side 212 opposite to the upper side 211, the pivoting portion 220 is connected to the main body 210 at the position adjacent to the lower side 212, and the engaging portion 230 is connected to the main body 210 at the upper side 211. In this embodiment, the main body 210 includes a plate structure, and the pivoting portion 220 and the engaging portion 230 are substantially extended along the direction that is perpendicular to the main body 210.

The pivoting portion 220 of the cover 200 is pivotally connected to the hinge 300, and the hinge 300 is slidably connected to the guiding slot 141. Therefore, the cover 200 is movable and rotatable relative to the housing 100.

The locking member 400 can be connected to the main body 210 of the cover 200 at the position adjacent to the upper side 211. For example, the locking member 400 can be a float screw, a magnet, or other structure(s) on the cover 200 to affix the cover 200 to the housing 100, but it is not limited thereto.

The main body 210 also has an outer surface 213 and an inner surface 214 opposite to the outer surface 213. The label 500 is attached on the outer surface 213. The type of the electronic device E in the corresponding portion and/or maintenance record of the electronic device E can be shown on the label 500. In some embodiments, the label 500 can include a printed paper or a display module. In some embodiments, the label 500 can be formed on the outer surface 213 by screen printing.

In this embodiment, the extending directions of the pivoting portion 220 and the extending direction of the engaging portion 230 are opposite. In detail, the pivoting portion 220 can protrude from the outer surface 213, and the engaging portion 230 can protrude from the inner surface 214.

Figure 4A:
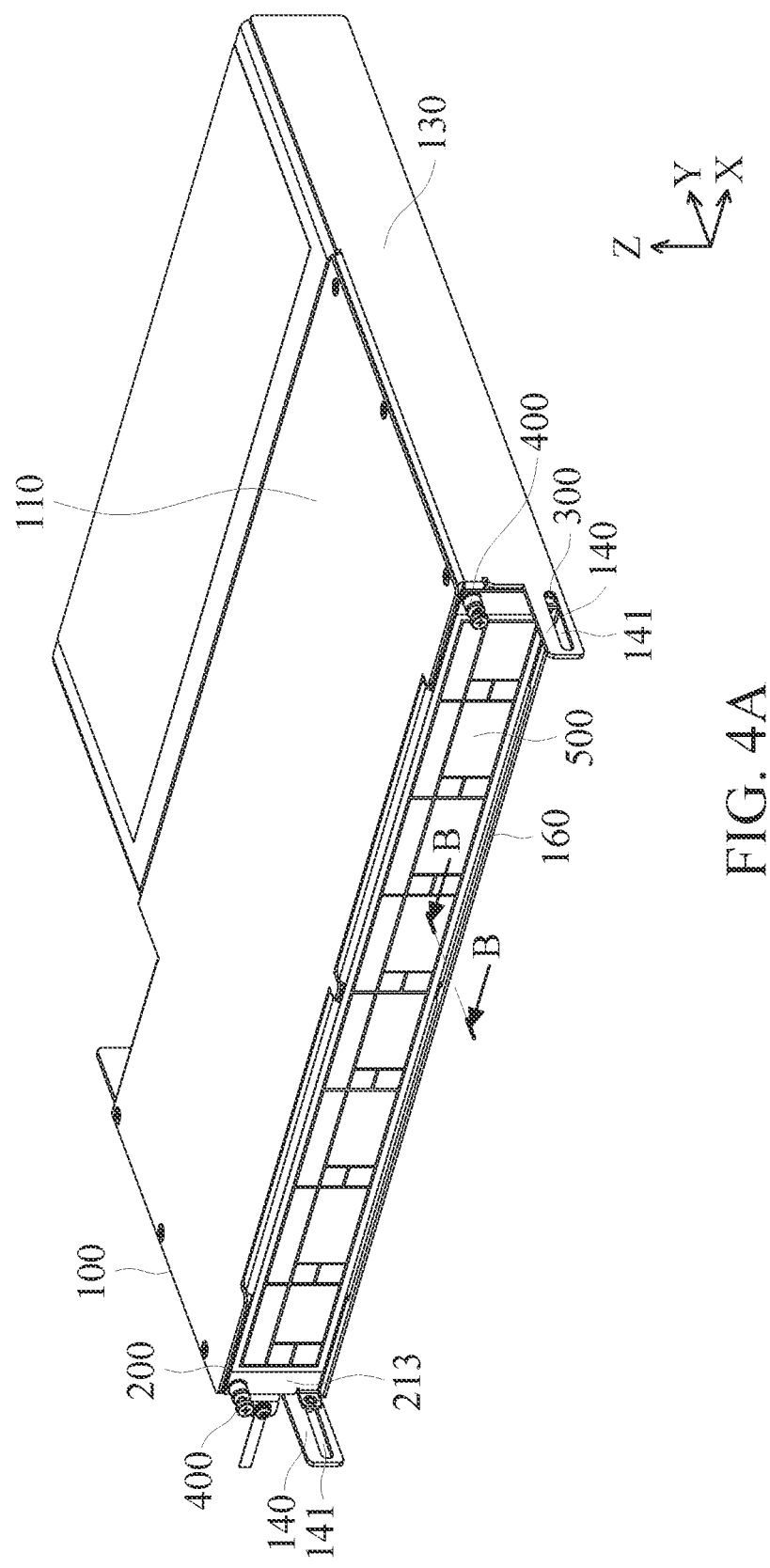
FIG. 4A is a schematic diagram of the case according to an embodiment of the invention, wherein the cover is in the closed position.
Figure 4B:
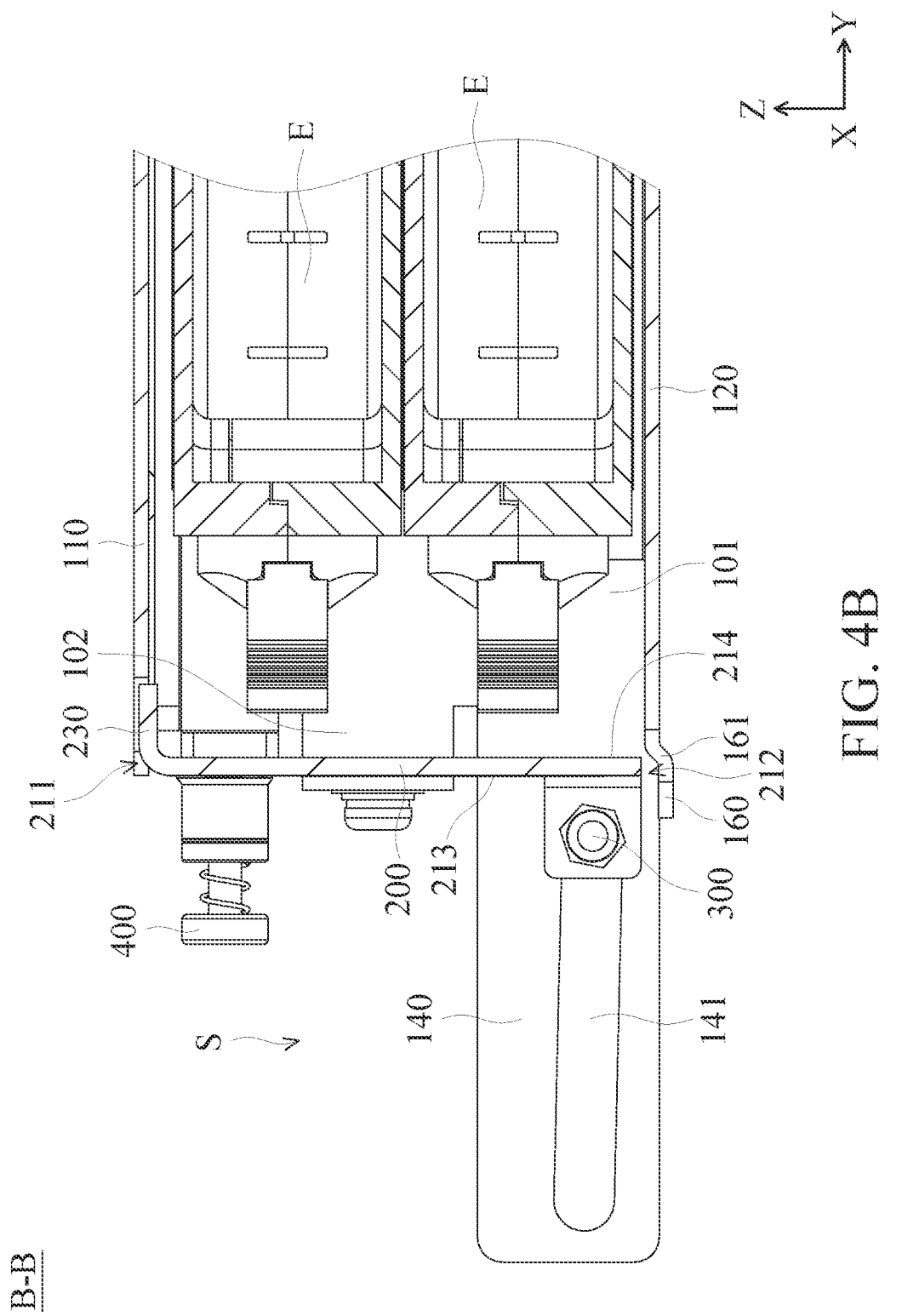
FIG. 4B is a cross-sectional view taken along the line B-B in FIG. 4A.

The usage method of the aforementioned case C is discussed below. Referring to FIG. 4A and FIG. 4B, when the cover 200 is in the closed position, the hinge 300 is in a first position of the guiding slot 141, and the locking member 400 affix the main body 210 to the locking portion 150, so as to affix the upper side 211 of the cover 200 to the locking portion 150 of the housing 100. Thus, the cover 200 is disposed between the environment space S and the accommodating space 101, and covers the opening 102, so that the foreign body (such as the dust) can be prevented from entering the accommodating space 101. In this embodiment, the distance between the upper side 211 and the lower side 212 of the cover 200 is substantially the same as the height of the opening 102 in the Z-axis, so that the cover 200 can entirely cover the opening 102 when the cover 200 is in the closed position.

Since the outer surface 213 of the cover 200 faces the environment space S when the cover 200 is in the closed position, the label 500 can be exposed from the environment space S. Thus, the user can directly obtain the information of the electronic device E in the corresponding position without opening the cover 200.

Figure 5A:
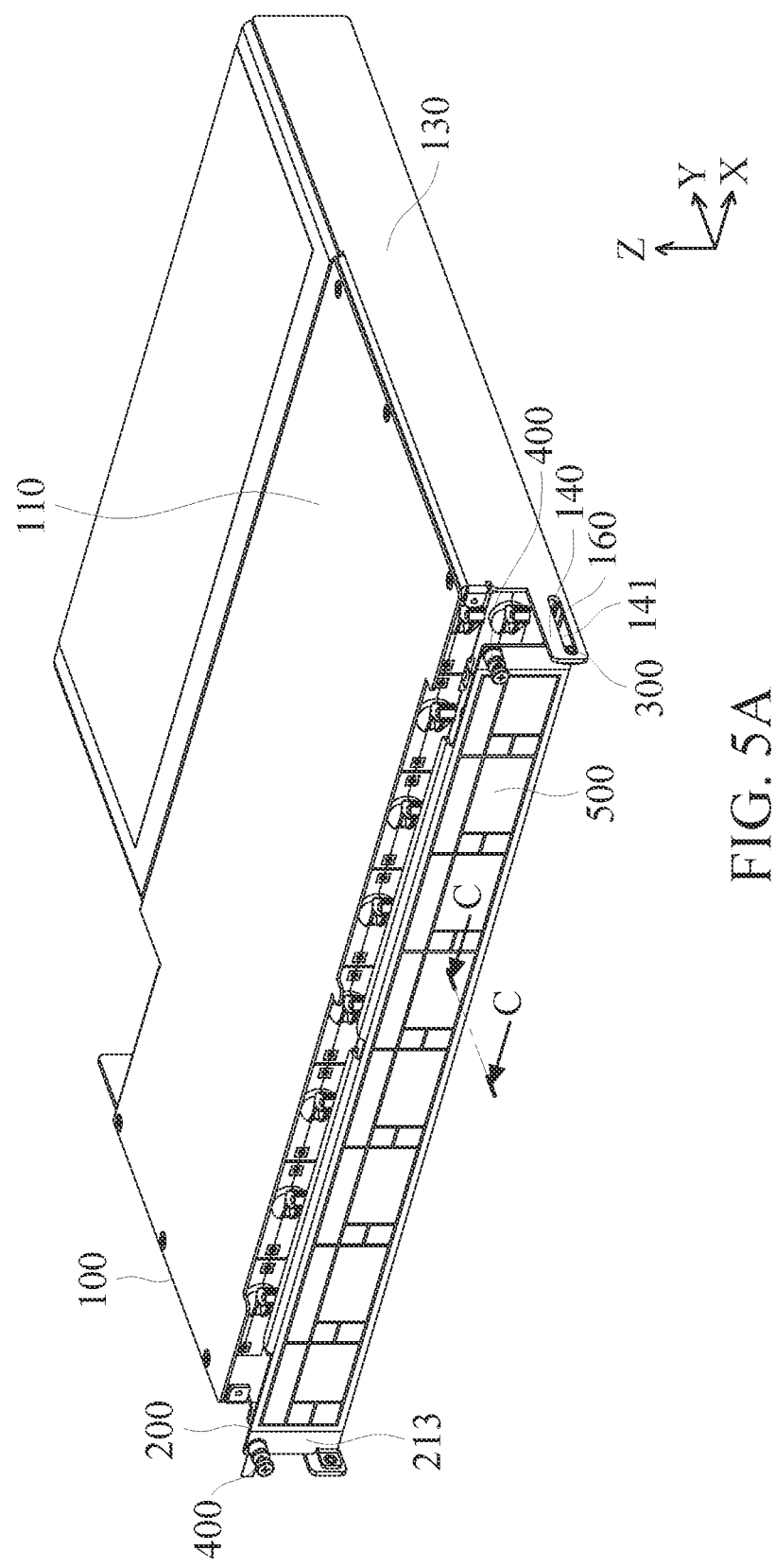
FIG. 5A is a schematic diagram of the case according to an embodiment of the invention, wherein the cover is pulled and the hinge moves from a first position to a second position.
Figure 5B:
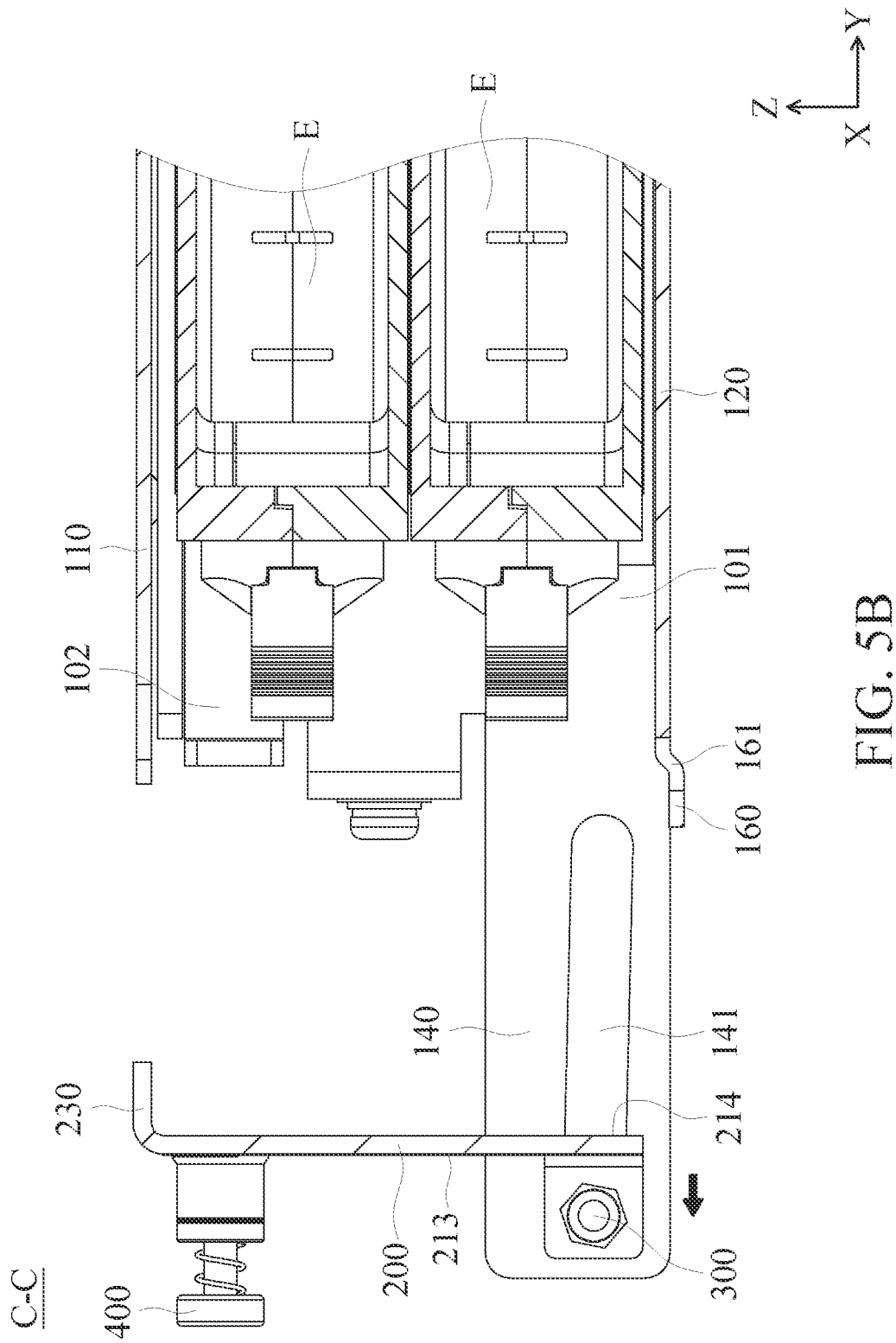
FIG. 5B is a cross-sectional view taken along the line C-C in FIG. 5A.

Referring to FIG. 5A and FIG. 5B, when the user desires to maintain, replace or remove the electronic device E in the accommodating space 101, the user can release the locking member 400 and pull the cover 200, and the hinge 300 can move along the guiding slot 141 in a moving direction that is away from the opening 102 from the first position to a second position. In other words, the first position is disposed between the second position and the opening 102. When the hinge 300 is in the second position, the cover 200 does not cover the opening 102 anymore.

Figure 6A:
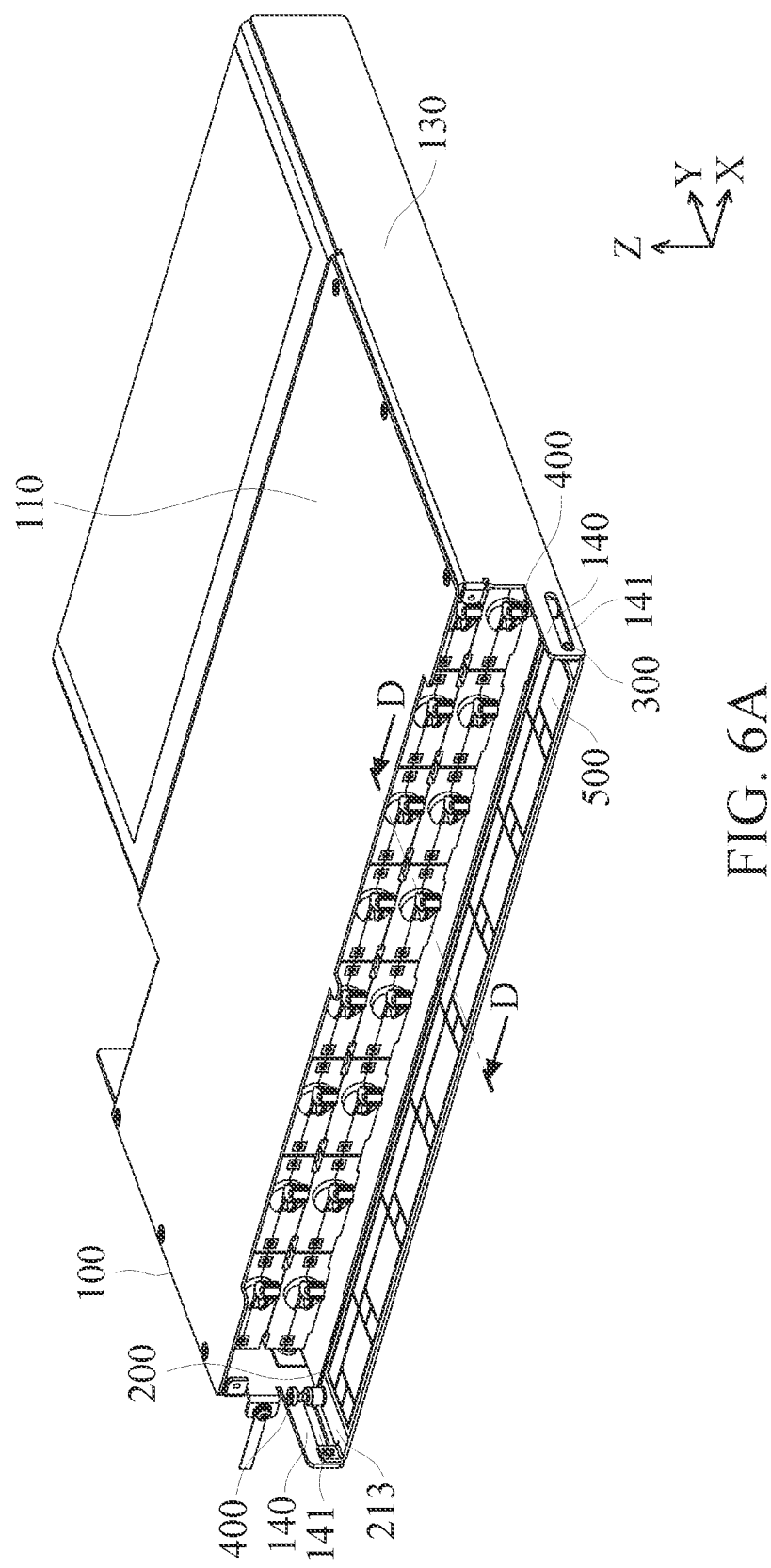
FIG. 6A is a schematic diagram of the case according to an embodiment of the invention, wherein the cover is in the open position.

Subsequently, referring to FIG. 6A and FIG. 6B, the upper side 211 of the cover 200 can rotate toward the opening 102, so that the cover 200 can rotate to the open position, and the inner surface 214 can be in contact with the protruding edge 160. Thus, the cover 200 can be horizontally disposed in front of the opening 102. Since the outer surface 213 of the cover 200 still faces the environment space S and the label 500 is still exposed from the environment space S, the information of the electronic device E can be directly obtained, and the user can directly notes new records on the label 500. Since the distance D1 between the top wall 110 and the bottom wall 120 is less than the distance D2 between the top wall 110 and the protruding edge 160, the electronic device E can be pulled out from the accommodating space 101 without blocking by the protruding edge 160. In this embodiment, when the cover 200 is in the open position, the outer surface 213 of the cover 200 is aligned with the upper surface 121 of the bottom wall 120.

Moreover, in this embodiment, when the cover 200 is in the open position, the engaging portion 230 can be inserted into the hole 161 on the protruding edge 160, so as to position the cover 200 more precisely.

Figure 6B:
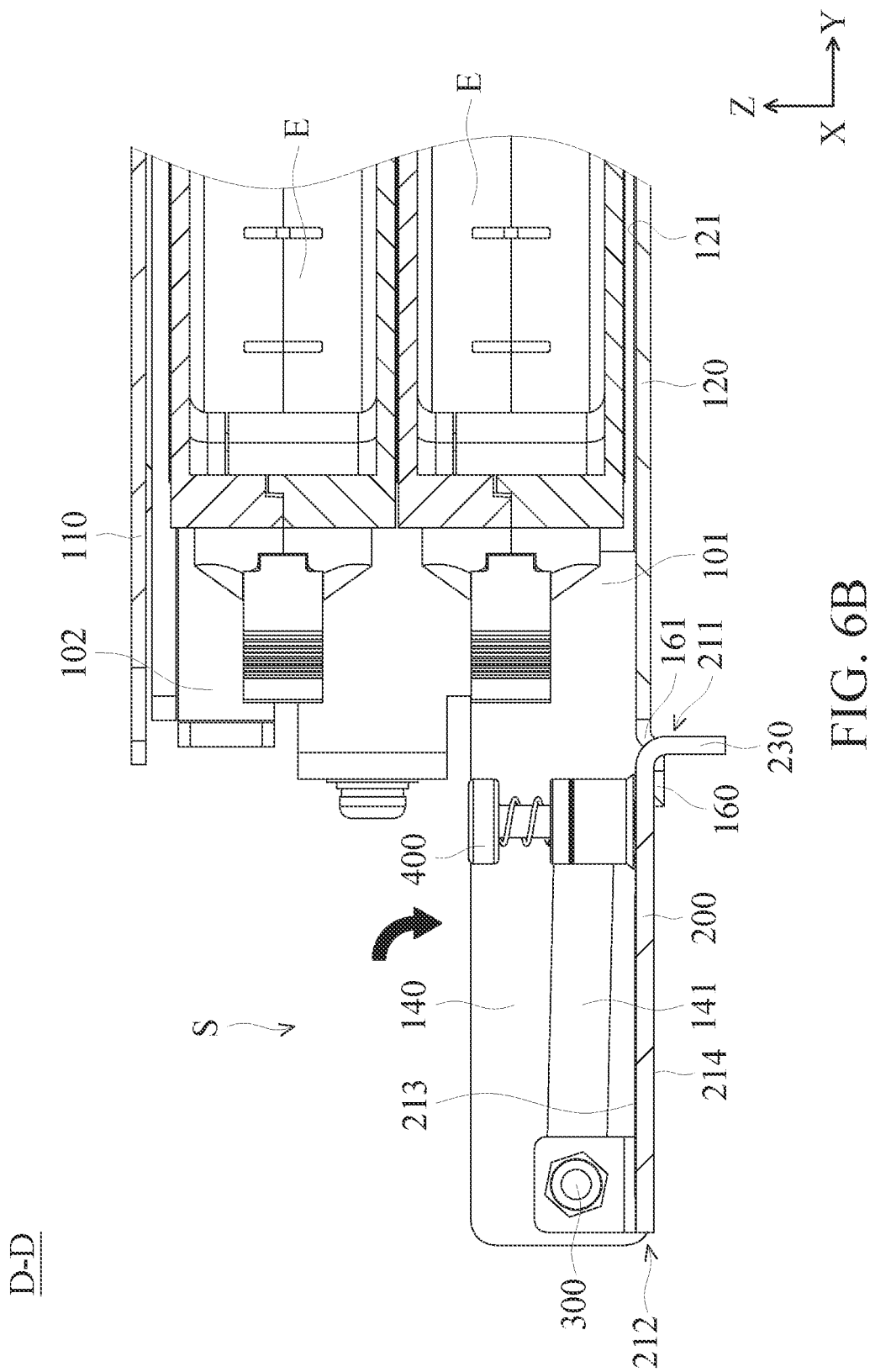
FIG. 6B is a cross-sectional view taken along the line D-D in FIG. 6A.

When the user desires to move the cover 200 from the open position to the closed position, the user can rotate the cover 200 in the direction that is opposite to the direction shown in FIG. 6B, push the cover 200 to move the hinge 300 from the second position to the first position, and use the locking member 400 to affix the cover 200 to the housing 100.

Figure 7A:
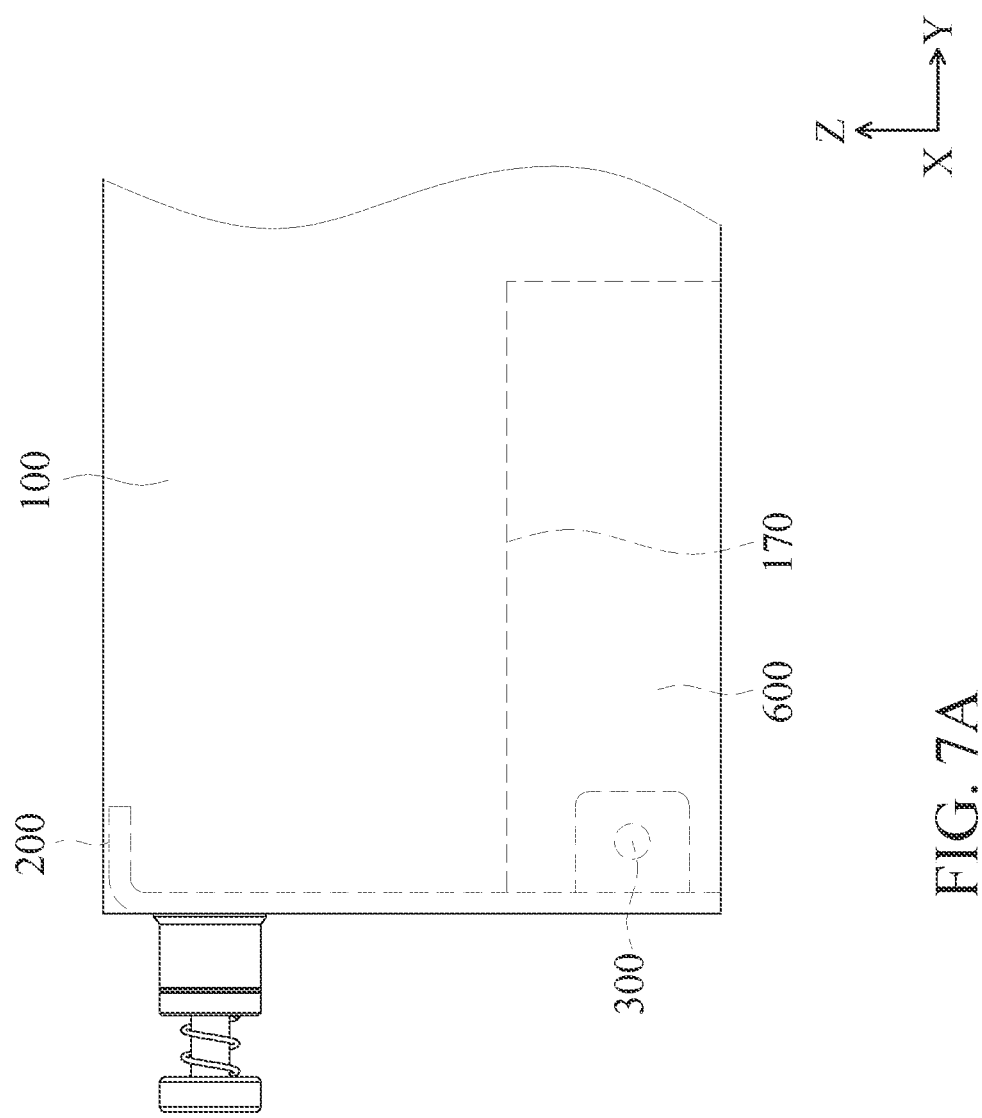
FIG. 7A is a schematic diagram of the case according to another embodiment of the invention, wherein the cover is in the closed position.
Figure 7B:
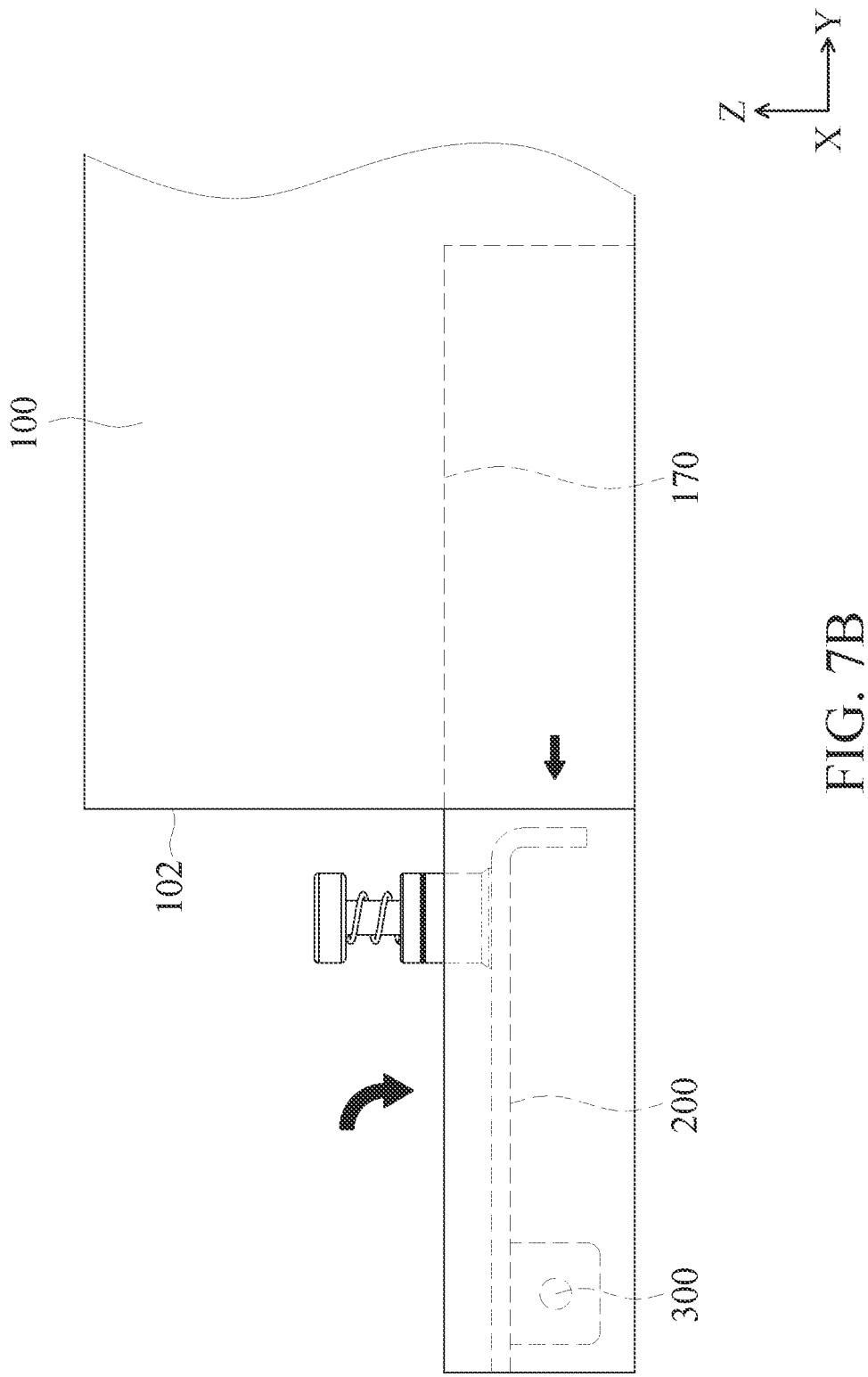
FIG. 7B is a schematic diagram of the case according to another embodiment of the invention, wherein the cover is in the open position.

Please referring to FIGS. 7A and 7B, in another embodiment of the invention, the housing 100 does not include the guiding portion 140, which is extending toward the environment space S and protrudes from the opening 102. On the contrary, the housing 100 has a rail 170, and the case C further includes a slider 600 slidably connected to the rail 170. The hinge 300 can be affixed to the slider 600. Therefore, when the cover 200 is in the closed position, the slider 600 is received in the rail 170 and the hinge 300 is in the first position. Since the slider 600 does not protrude from the opening 102, the miniaturization of the case C can be achieved.

When the user desires to maintain, replace or remove the electronic device E, the slider 600 can move relative to the housing 100 to move the hinge 300 from the first position to the second position, and the cover 200 can rotate to the open position (FIG. 7B).

In summary, an embodiment of the invention provides a case for receiving at least one electronic device, including a housing, a hinge, a locking member, and a cover. The housing has an accommodating space and an opening that is communicated with the accommodating space, wherein the accommodating space is configured to receive the electronic device. The hinge is slidably connected to the housing. The cover has an upper side, a lower side, and an outer surface, wherein the upper side is detachably connected to the housing by the locking member, and the lower side is pivotally connected to the hinge. When the locking member affixes the upper side to the housing and the hinge is in a first position relative to the housing, the cover is disposed between an environment space and the accommodating space, and the outer surface faces the environment space. When the locking member is released and the hinge moves from the first position to a second position relative to the housing, the cover leaves the position between the environment space and the accommodating space, and the outer surface faces the environment space.

A case for receiving at least one electronic device is also provided, including a housing, a cover, and a label. The housing has an accommodating space, an opening that is communicated with the accommodating space, and a protruding edge, wherein the opening is disposed between the protruding edge and the accommodating space. The label is disposed on the cover. When the cover is in the closed position, the cover covers the opening, and the label is exposed from an environment space. When the cover moves and rotates from the closed position to the open position, the cover is in contact with the protruding edge, the accommodating space is communicated with the environment space via the opening, and the label is exposed from the environment space.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A case for receiving at least one electronic device, comprising:
   a housing, having an accommodating space and an opening, wherein the accommodating space is configured to receive the electronic device, and the opening is communicated with the accommodating space;
   a hinge, slidably connected to the housing;
   a locking member; and
   a cover, having an upper side, a lower side, and an outer surface, wherein the upper side is detachably connected to the housing by the locking member, and the lower side is pivotally connected to the hinge,
   wherein when the locking member affixes the upper side to the housing and the hinge is in a first position relative to the housing, the cover is disposed between an environment space and the accommodating space, and the outer surface faces the environment space,
   wherein when the locking member is released and the hinge moves from the first position to a second position relative to the housing, the cover leaves the position between the environment space and the accommodating space, and the outer surface faces the environment space,
   wherein the housing comprises a protruding edge, a top wall, and a bottom wall, the opening is disposed between the protruding edge and the accommodating space, the accommodating space is formed between the top wall and the bottom wall, and the protruding edge is extended from the bottom wall and exceeds the opening, wherein when the locking member is released and the hinge moves from the first position to the second position relative to the housing, an inner surface of the cover is in contact with the protruding edge,
   wherein the distance between the top wall and the bottom wall is less than the distance between the top wall and the protruding edge.

2. The case as claimed in claim 1, wherein a hole is formed on the protruding edge, and the cover has an engaging portion, wherein when the locking member is released and the hinge moves from the first position to the second position relative to the housing, the engaging portion is inserted into the hole.

3. The case as claimed in claim 1, wherein the bottom wall has an upper surface facing the top wall, and when the locking member is released and the hinge moves from the first position to the second position relative to the housing, the outer surface of the cover is aligned with the upper surface of the bottom wall.

4. The case as claimed in claim 1, wherein the housing comprises a guiding slot, and the hinge is slidably disposed in the guiding slot.

5. The case as claimed in claim 4, wherein the housing further comprises a bottom wall, and a longitudinal axis of the guiding slot is inclined relative to an upper surface of the bottom wall.

6. The case as claimed in claim 4, wherein the opening is situated between the guiding slot and the accommodating space.

7. The case as claimed in claim 1, wherein the housing comprises a rail, the case further comprises a slider slidably connected to the rail, and the hinge is affixed to the slider.

8. The case as claimed in claim 7, wherein when the hinge is in the first position relative to the housing, the slider does not protrude from the opening.

9. The case as claimed in claim 1, wherein the case further comprises a label attached to the outer surface.

10. A case for receiving at least one electronic device, comprising:
    a housing, having an accommodating space, an opening, and a protruding edge, wherein the accommodating space is configured to receive the electronic device, the opening is communicated with the accommodating space, and the opening is disposed between the protruding edge and the accommodating space;
    a cover; and
    a label, disposed on the cover, wherein when the cover is in a closed close position, the cover covers the opening, and the label is exposed from an environment space, wherein when the cover moves and rotates from the closed position to an open position, the cover is in contact with the protruding edge, the accommodating space is communicated with the environment space via the opening, and the label is exposed from the environment space,
    wherein the housing further comprises a top wall and a bottom wall, the accommodating space is formed between the top wall and the bottom wall, and the protruding edge is connected to the bottom wall,
    wherein the label is attached to an outer surface of the cover, and the bottom wall has an upper surface facing the top wall, wherein when the cover is in the open position, the outer surface of the cover is aligned with the upper surface of the bottom wall.

11. The case as claimed in claim 10, wherein a hole is formed on the protruding edge, and the cover has an engaging portion, wherein when the cover is in the open position, the engaging portion is inserted into the hole.

12. The case as claimed in claim 10, wherein the distance between the top wall and the bottom wall is less than the distance between the top wall and the protruding edge.

13. The case as claimed in claim 10, wherein the case further comprises a hinge, and the cover is pivotally connected to the housing via the hinge.

14. The case as claimed in claim 13, wherein the hinge and the protruding edge are adjacent to a same side of the housing.

15. The case as claimed in claim 13, wherein the hinge is movable relative to the housing in a moving direction, and the housing further comprises a bottom wall, wherein the moving direction is inclined relative to an upper surface of the bottom wall.

\* \* \* \* \*